United States Patent
Fujikura

(10) Patent No.: US 11,549,196 B2
(45) Date of Patent: Jan. 10, 2023

(54) ALUMINUM NITRIDE LAMINATE MEMBER AND ALUMINUM NITRIDE LAYER

(71) Applicant: SUMITOMO CHEMICAL COMPANY, LIMITED, Tokyo (JP)

(72) Inventor: Hajime Fujikura, Hitachi (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 400 days.

(21) Appl. No.: 16/783,874

(22) Filed: Feb. 6, 2020

(65) Prior Publication Data

US 2020/0255978 A1 Aug. 13, 2020

(30) Foreign Application Priority Data

Feb. 13, 2019 (JP) .............. JP2019-023915

(51) Int. Cl.
 C30B 29/40 (2006.01)
 H01L 33/22 (2010.01)
 C30B 29/20 (2006.01)
 H01L 33/12 (2010.01)

(52) U.S. Cl.
 CPC .......... *C30B 29/403* (2013.01); *C30B 29/20* (2013.01); *H01L 33/22* (2013.01); *H01L 33/12* (2013.01)

(58) Field of Classification Search
 CPC ....... C30B 29/403; C30B 29/20; H01L 33/22; H01L 33/33; H01L 33/12; H01L 21/002631

USPC ......................................... 428/167
See application file for complete search history.

(56) References Cited

U.S. PATENT DOCUMENTS

2004/0263062 A1* 12/2004 Fujii ................. H01L 33/22
                                                         313/501
2012/0258286 A1  10/2012 Amano et al.

FOREIGN PATENT DOCUMENTS

WO  WO-2011/077541 A1  6/2011

OTHER PUBLICATIONS

Fujita et al., "HVPE growth of thick AlN on trench-patterned substrate," Physica Status Solidi C, vol. 8, No. 5, 2011, pp. 1483-1486.

* cited by examiner

*Primary Examiner* — Thinh T Nguyen
(74) *Attorney, Agent, or Firm* — Foley & Lardner LLP

(57) ABSTRACT

There is provided an aluminum nitride laminate member including: a sapphire substrate having a base surface on which bumps are distributed periodically, each bump having a height of smaller than or equal to 500 nm; and an aluminum nitride layer provided on the base surface and having a surface on which protrusions are formed above the apices of the bumps.

16 Claims, 8 Drawing Sheets a = HEIGHT DIFFERENCE    b = DISTANCE    c = ANGLE DIFFERENCE a = HEIGHT DIFFERENCE   b = DISTANCE   c = ANGLE DIFFERENCE a = HEIGHT DIFFERENCE  b = DISTANCE  c = ANGLE DIFFERENCE

ALUMINUM NITRIDE LAMINATE MEMBER AND ALUMINUM NITRIDE LAYER

BACKGROUND

Technical Field

The present disclosure relates to an aluminum nitride laminate member and an aluminum nitride layer.

Description of the Related Art

Techniques for growing an aluminum nitride (AlN) layer on a sapphire substrate on which a periodic bump-and-dip shape is formed are proposed, for example, as a method for producing light-emitting diodes (LEDs) (see, for example, non-patent document 1). A shape in which dips are distributed periodically (while being spaced apart) and a shape in which bumps are distributed periodically (while being spaced apart) are known as the bump-and-dip shape of a sapphire substrate.

Non-patent document 1: H. Miyake, etc. "HVPE growth of thick AlN on trench-patterned substrate", Phys Status Solidi C 8, No.5, 1483-1486 (2011)

In the state of the art, use of a sapphire substrate having periodically distributed bumps results in the growth of irregular, disorderly AlN crystals, so it is not possible to control the condition of an AlN layer during growth.

SUMMARY

One objective of the present disclosure is to provide a technique of using a sapphire substrate on which bumps are distributed periodically to grow an AlN layer in a controlled condition, specifically an AlN layer having periodically formed protrusions on a surface thereof.

In an aspect of the present disclosure, there is provided
an aluminum nitride laminate member including
a sapphire substrate having a base surface on which bumps are distributed periodically, each bump having a height of smaller than or equal to 500 nm, and
an aluminum nitride layer provided on the base surface and having a surface on which protrusions are formed above apices of the bumps.

In another aspect of the present disclosure, there is provided
an aluminum nitride layer having a surface on which protrusions are formed periodically, wherein
in a plan view, the external shape of each of the protrusions is a shape of a hexagon
for each of the protrusions, the height of the protrusion is larger than or equal to the size of the protrusion, the size being defined by the length of a diagonal passing through the center of the hexagon,
for each of the protrusions, the size of the protrusion is smaller than or equal to ½ a pitch between the protrusion and the closest adjacent protrusion among the protrusions, the size being defined by the length of a diagonal passing through the center of the hexagon, and
in portions of the surface on the outside of the protrusions, dips are formed at bases of the protrusions.

In another aspect of the present disclosure, there is provided
an aluminum nitride layer having a surface on which protrusions are formed periodically, wherein
in a plan view, the external shape of each of the protrusions is a shape of a hexagon
for each of the protrusions, the height of the protrusion is smaller than the size of the protrusion, the size being defined by the length of a diagonal passing through the center of the hexagon,
for each of the protrusions, the size of the protrusion is larger than ½ a pitch between the protrusion and the closest adjacent protrusion among the protrusions, the size being defined by the length of a diagonal passing through the center of the hexagon, and
a bulge is formed at the center of each of the protrusions.

There is provided a technique of using a sapphire substrate on which bumps are distributed periodically to grow an AlN layer having periodically formed protrusions on a surface thereof.

DETAILED DESCRIPTION OF THE DISCLOSURE

First Embodiment

Figure 1:
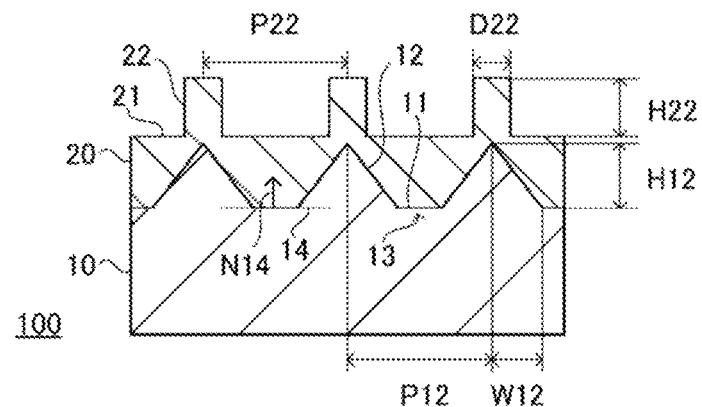
FIG. 1 is an illustrative schematic cross-sectional diagram of a laminate member 100 in a first embodiment of the present disclosure.

Described will be an aluminum nitride (AlN) laminate member 100 (also referred to as "laminate member 100" below) in a first embodiment of the present disclosure. FIG. 1 is an illustrative schematic cross-sectional diagram of the laminate member 100 in the first embodiment. The laminate member 100 includes a sapphire substrate 10 (also referred to as "substrate 10" below) and an AlN layer 20 (also referred to as "layer 20" below) grown on the substrate 10. The layer 20 in this embodiment is characterized by having protrusions 22 that are formed by being grown on a surface 21 of the layer 20.

The substrate 10 is formed from single crystal sapphire and has a base surface 11 serving as a base on which to grow the layer 20. The base surface 11 has a plurality of bumps 12 that are distributed periodically (while being spaced apart). The shape of each bump 12 may be conical, for example. In this embodiment, a "conical" shape encompasses the shape of a circular cone and a pyramid, and encompasses not only a shape having a sharp apex but also a shape having a flat apex (truncated cone). This example illustrates a mode in which the bumps 12 are circular cones.

Portions 13 of the base surface 11 that are located on the outside of the bumps 12 (these portions 13 will also be referred to as "valleys 13" below) are located on a (virtual) plane 14. The bumps 12 can be regarded as being distributed on the plane 14, and the direction N14 normal to the plane 14 coincides with the height direction of the bumps 12. The height H12 of each bump 12 is defined by the distance between the plane 14 and the upper end of the bump 12. The bumps 12 are formed in such a way that the height direction of the bumps 12 is parallel to the c-axis direction of the sapphire forming the substrate 10. The sapphire c-face is exposed at the apex of each bump 12. Note that in this description, the concept of one direction D1 being parallel to another direction D2 means that the angle formed between the directions D1 and D2 is no more than 3 degrees.

Figure 2:
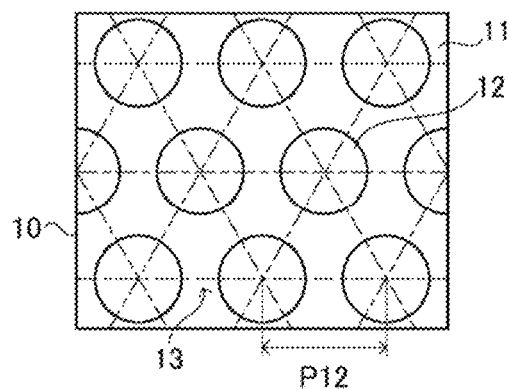
FIG. 2 is an illustrative schematic plan view of a substrate 10 in the first embodiment.

FIG. 2 is an illustrative schematic plan view of the substrate 10. In this embodiment, the bumps 12 may be distributed on lattice points of a triangular lattice, quadrangular lattice, a hexagonal lattice, or the like, thereby being distributed in a two-dimensionally periodic fashion. This example illustrates a mode in which the bumps 12 are distributed on lattice points of an equilateral triangular lattice. The axial directions of the equilateral triangular lattice are indicated by the dash dot lines. The axial directions of the lattice (e.g. triangular lattice) in which the bumps 12 are distributed are not particularly limited, but may be, for example, parallel to an m-axis direction or an a-axis direction of the sapphire forming the substrate 10.

The layer 20 is formed from AlN that is grown on the base surface 11 of the substrate 10. The surface (upper surface) 21 of the layer 20 has a plurality of protrusions 22 that are formed during growth of the layer 20. Each protrusion 22 is formed above the apex of the corresponding bump 12 of the substrate 10. The protrusions 22 are spaced apart from one another. As a result of the crystal orientation of the AlN forming the protrusions 22 being controlled by the c-face exposed at the apex of each bump 12, the c-axis direction of the AlN is parallel to the height direction of the bumps 12. Accordingly, the c-axis directions of the AlN forming the protrusions 22 are parallel to one another.

Figure 3:
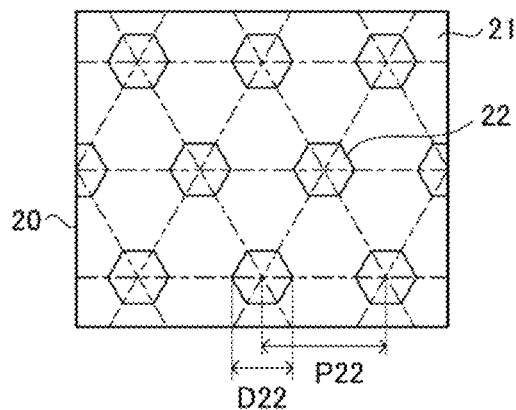
FIG. 3 is an illustrative schematic plan view of a layer 20 in the first embodiment.

FIG. 3 is an illustrative schematic plan view of the layer 20.

This example illustrates a mode in which, in correspondence to FIG. 2, the protrusions 22 are distributed on lattice points of an equilateral triangular lattice. In a plan view, the external shape of each protrusion 22 is hexagonal. The directions in which the center and the vertices of each hexagon are connected (i.e. the directions of the diagonals connecting the vertices opposing each other across the center) coincide with the a-axis directions of the AlN forming the protrusion 22. This example illustrates a case where the axial directions of the equilateral triangular lattice in which the bumps 12 are distributed (hence the protrusions 22 are distributed) are parallel to an m-axis direction of the sapphire forming the substrate 10. Accordingly, an a-axis direction of the AlN forming the layer 20 is parallel to the axial directions of the equilateral triangular lattice. That is, the a-axis directions of the AlN forming the protrusions 22 are parallel to one another. In heteroepitaxial growth of the AlN above the sapphire c-face, the AlN grows in such a way that an m-axis direction of the sapphire and an a-axis direction of the AlN are parallel to each other, i.e. an a-axis direction of the sapphire and an m-axis direction of the AlN are parallel to each other.

The inventors of the present disclosure have discovered that in order to highly selectively grow the protrusions 22 above the apices of the bumps 12, it is preferred that the height H12 of the bumps 12 be low, as will be shown in experiment examples 1-3 below. Specifically, the height H12 of each bump 12 is preferably smaller than or equal to 500 nm, more preferably smaller than or equal to 300 nm. Meanwhile, although there are no particular limitations on the lower limit for the height H12 of the bumps 12, from the standpoint of giving a clear definition of the bumps 12, the height H12 of each bump 12 may be set to larger than or equal to 50 nm, more preferably larger than or equal to 100 nm, for example.

The following is assumed to be a possible reason why it is preferable for the height H12 of the bumps 12 to be lower. As will be described later, it is preferred that the layer 20 be grown by vapor phase epitaxy, e.g. hydride vapor phase epitaxy (HVPE), and the base surface 11 undergoes ultraviolet (UV) irradiation treatment before growth of the layer 20. When the base surface 11 undergoes UV irradiation treatment, the condition of the terminal of the base surface 11 changes due to UV irradiation, and this is considered to result in an increase in smoothness, i.e. the ease with which Al atoms can move on the base surface 11.

It is considered that in order for the protrusions 22 to be grown selectively above the apices of the bumps 12, it is preferable for Al atoms adhering to various locations on the base surface 11 to be easily movable to the vicinity of the apices of the bumps 12. It is considered that the reason for which the protrusions 22 can be highly selectively grown above the apices of the bumps 12 in this embodiment is that the height H12 of the bumps 12 is sufficiently low and, moreover, the base surface 11 undergoes UV irradiation treatment, thereby making it possible for the Al atoms adhering to various locations on the base surface 11 to easily move to the vicinity of the apices of the bumps 12. Preferable growth conditions (growth temperature, V/III ratio, etc.) for growing the protrusions 22 will be described later.

For the purpose of facilitating movement of the Al atoms to the vicinity of the apices of the bumps 12 (i.e. shortening the movement distance), it is more preferable that the width W12 of the slant surface of each bump 12, in a plan view, be smaller. Alternatively, it is more preferable that the pitch P12 between closest adjacent bumps 12 be smaller. Specifically, the width W12 is preferably smaller than or equal to 500 nm and the pitch P12 is preferably smaller than or equal to 1000 nm.

The length of a diagonal passing through the center of the hexagon constituting the external shape of each protrusion 22 in a plan view defines the size D22 of the protrusion 22 (in a plan view). The distance from the base (lower end) of each protrusion 22 and the upper end of the same protrusion 22 on the surface 21 of the layer 20 defines the height H22 of the protrusion 22. The distance between the centers of closest adjacent protrusions 22 in a plan view defines the pitch P22 between the protrusions 22. The pitch P22 between the protrusions 22 and the pitch P12 between the bumps 12 may be considered equivalent.

The inventors of the present disclosure have discovered that it is also possible to form protrusions 22 having the shape of a long, thin rod, as will be described in experiment example 2 (see FIGS. 5A through 5C) and experiment example 3 (see FIGS. 6A through 6C) below, as well as protrusions 22 having the shape of a large flat plate, as will be described in experiment example 4 (see FIGS. 8A and 8B) below.

Here, a protrusion 22 having a height H22 that is larger than or equal to the size D22 thereof (H22≥D22) will be described as being "rod"-like, whereas a protrusion 22 having a height H22 that is smaller than the size D22 thereof (H22<D22) will be described as being "plate"-like. In addition, a protrusion 22 having a size D22 that is smaller than or equal to ½ the pitch P22 thereof (D22≤(½)×P22) will be described as having a "small diameter", whereas a protrusion 22 having a size D22 that is larger than ½ the pitch P22 thereof (D22>(½)×P22) will be described as having a "large diameter".

The first embodiment and experiment examples 2 and 3 pertaining to the first embodiment exemplify rod-like protrusions 22 and protrusions 22 having a small diameter. A second embodiment and experiment example 4 pertaining to the second embodiment below will exemplify plate-like protrusions 22 and protrusions 22 having a large diameter.

Next, a method of manufacturing the laminate member 100 will be described. The substrate 10 is prepared. The height H12 of the bumps 12 on the substrate 10 is set to be smaller than or equal to 500 nm. It is preferable that the width W12 of the slant surfaces of the bumps 12 be smaller than or equal to 500 nm and that the pitch P12 of the bumps 12 be smaller than or equal to 1000 nm. Such a substrate 10 can be produced using a technique for forming patterned sapphire substrates (PSS). The base surface 11 of the substrate 10 is subjected to UV irradiation treatment. It is preferred that the UV treatment be carried out for 10 minutes or more at the intensity of 10 mW/cm² or higher using, for example, a low-pressure mercury lamp, high-pressure mercury lamp, or other such light source encompassing a bright line at or below 300 nm.

On the base surface 11 having undergone the UV irradiation treatment, AlN is grown by vapor phase epitaxy, preferably HVPE, to form the layer 20. Aluminum monochloride (AlCl) gas or aluminum trichloride ($AlCl_3$) gas, for example, may be used as aluminum (Al) raw material gas, and ammonia ($NH_3$) gas may be used as nitrogen (N) raw material gas. These raw material gases may be supplied while being mixed with a carrier gas for which hydrogen gas ($H_2$ gas), nitrogen gas ($N_2$ gas), or a gas mixture of the two is used.

The following is an example of growth conditions that may be adopted in the first embodiment. The growth temperature may be 900° C.-1050° C. The V/III ratio, i.e. the supply ratio of N raw material gas to Al raw material gas, may be 20-200. The growth speed may be 200-500 nm/min. For the purpose of preventing adhesion of AlN to nozzles of gas supply pipes used to introduce various gases to a growth chamber in an HVPE apparatus, hydrogen chloride (HCl) gas may be flown, and the amount of HCl gas supplied may be set such that the ratio of the HCl gas to the AlCl gas or the $AlCl_3$ gas is 0.1-100.

In other words, in the first embodiment, the layer 20 is grown under the growth conditions including a relatively low temperature, relatively high V/III ratio, and relatively high speed (compared to the growth conditions of the second embodiment described later); accordingly, the protrusions 22 are formed highly selectively above the apices of the bumps 12 such that the protrusions 22 formed are rod-like and have a small diameter.

Next, experiment examples 1-3 pertaining to the first embodiment will be described. In these experiment examples, it was examined how the manner in which the layer 20 grows changes according to changes in the height H12, and the like, of the bumps 12. A substrate in which circular-conical bumps 12 were distributed in the form of an equilateral triangular lattice was used as the substrate 10. The axial directions of the equilateral triangular lattice were set to be parallel to an m-axis direction of the sapphire forming the substrate 10.

The height H12 of the bumps 12 were set to be 1600 nm, 440 nm, and 220 nm in experiment examples 1, 2, and 3, respectively. The width W12 of the slant surfaces of the bumps 12 were set to be 1200 nm, 350 nm, and 250 nm in experiment examples 1, 2, and 3, respectively. The pitch P12 of the bumps 12 were set to be 3000 nm, 1000 nm, and 600 nm in experiment examples 1, 2, and 3, respectively. The growth conditions of the first embodiment exemplified above were adopted as the growth conditions for the layer 20. The layer 20 was grown by an amount such that the layer 20 would have a thickness of 700 nm if grown on a flat base surface.

Figure 4B:
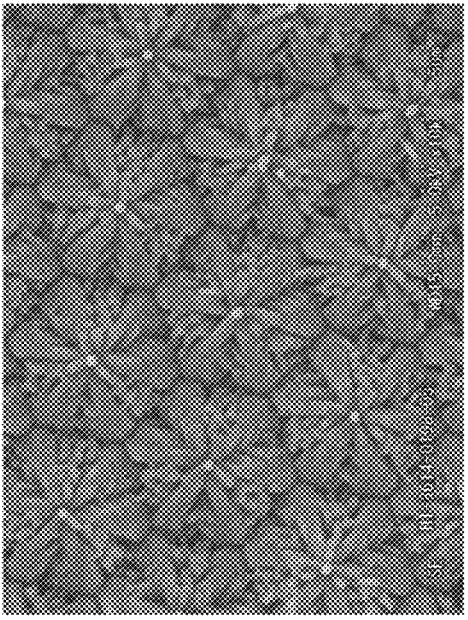
FIGS. 4A and 4B are an SEM perspective image and an SEM planar image showing results of experiment example 1.
Figure 4A:
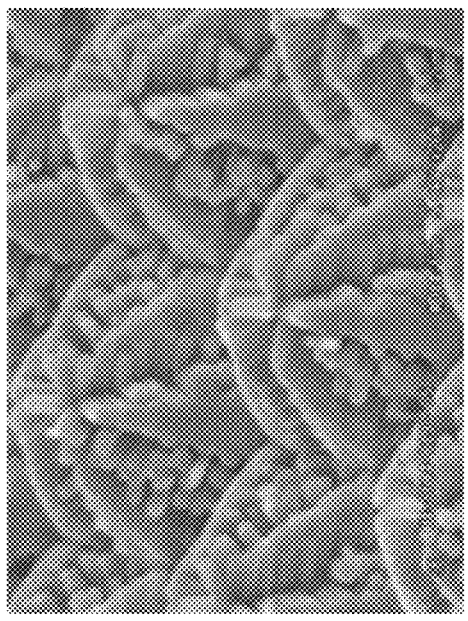
Figure 4C:
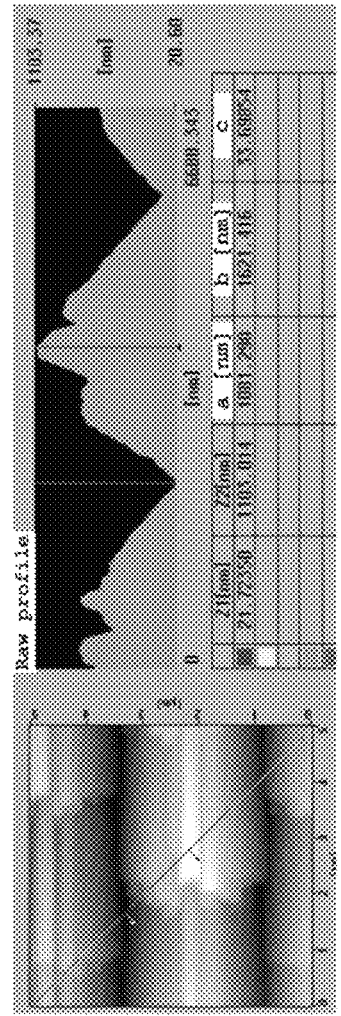
FIG. 4C is an AFM image and an AFM line profile showing results of experiment example 1.
Figure 5B:
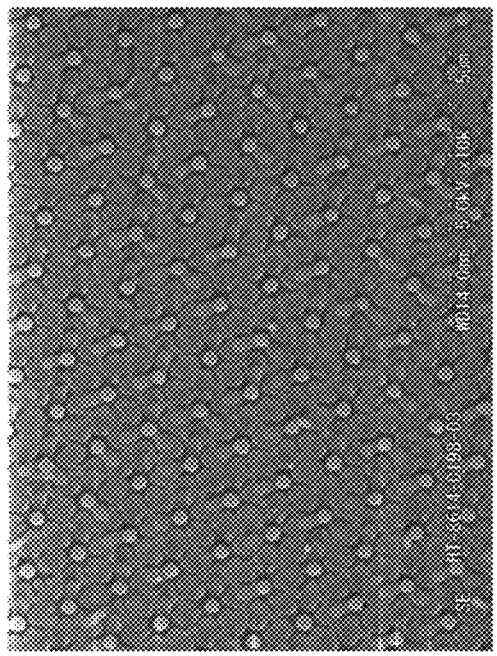
FIGS. 5A and 5B are an SEM perspective image and an SEM planar image showing results of experiment example 2.
Figure 5A:
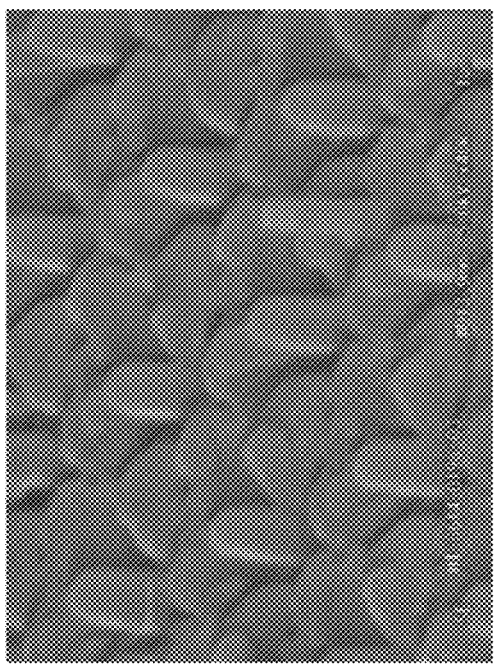
Figure 5C:
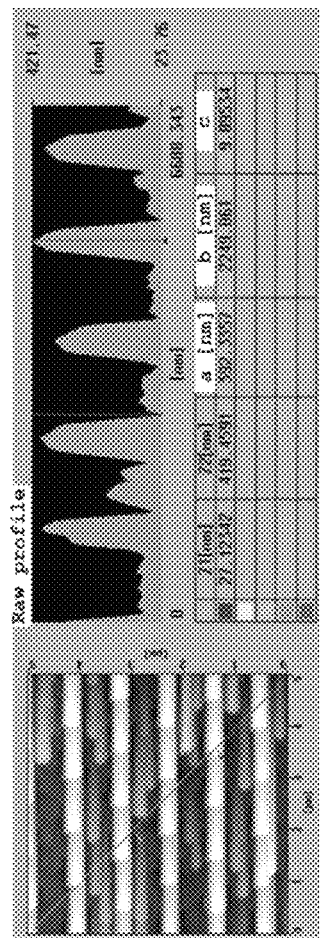
FIG. 5C is an AFM image and an AFM line profile showing results of experiment example 2.
Figure 6B:
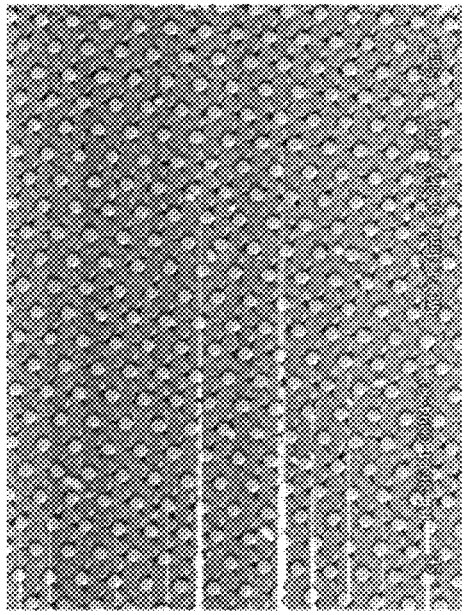
FIGS. 6A and 6B are an SEM perspective image and an SEM planar image showing results of experiment example 3.
Figure 6A:
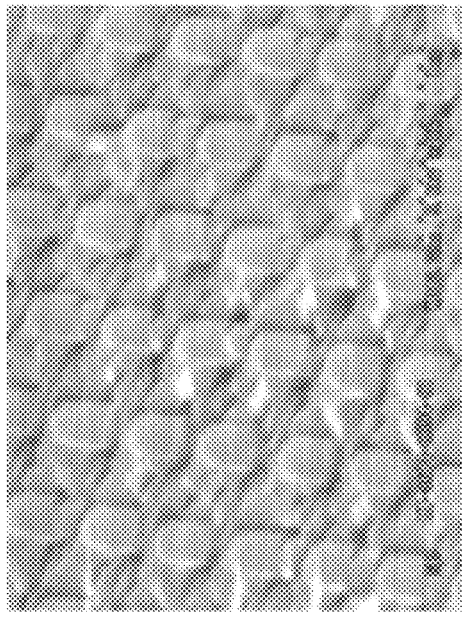
Figure 6C:
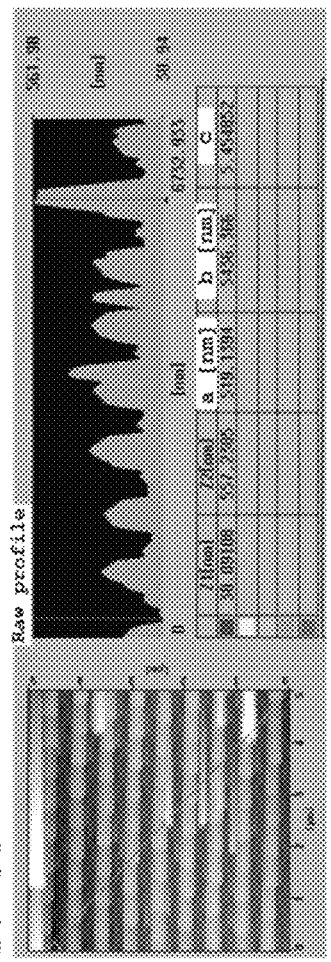
FIG. 6C is an AFM image and an AFM line profile showing results of experiment example 3.

FIGS. 4A, 4B, and 4C illustrate results of experiment example 1, FIGS. 5A, 5B, and 5C illustrate results of experiment example 2, and FIGS. 6A, 6B, and 6C illustrate results of experiment example 3. FIGS. 4A, 5A, and 6A are perspective images (scanning electron microscopy (SEM) perspective images) of the surface 21 of the layer 20 obtained using SEM, and FIGS. 4B, 5B, and 6B are planar images (SEM planar images) of the surface 21 of the layer 20 obtained using SEM. FIGS. 4C, 5C, and 6C are atomic force microscopy (AFM) images and AFM line profiles of the surface 21 of the layer 20.

As can be seen from the SEM perspective images and the SEM planar images, in experiment example 2 (bump height: 440 nm) and experiment example 3 (bump height: 220 nm), protrusions 22 are formed selectively on the surface 21 of the layer 20 at the lattice points of the equilateral triangular lattice corresponding to locations above the apices of the bumps 12. In contrast, in experiment example 1 (bump height: 1600 nm), no clear protrusions 22 are formed on the surface 21 of the layer 20 at the lattice points of the equilateral triangular lattice. In view of this, it can be said that in order for the protrusions 22 to be grown highly selectively above the apices of the bumps 12, the height H12 of the bumps 12 are preferably smaller than or equal to 500 nm, for example.

In the experiment examples 2 and 3: rod-like protrusions 22 having a small diameter are formed; the external shape of the protrusions 22 in a plan view is more or less an equilateral hexagon; and in conformity with the fact that the axial directions of the equilateral triangular lattice in which the bumps 12 are distributed are parallel to an m-axis direction of the sapphire forming the substrate 10, an a-axis direction of the AlN forming the protrusions 22, i.e. each of the directions in which the centers and the vertices of the hexagons of the protrusions 22 are connected, is parallel to the axial directions of the equilateral triangular lattice.

As can be seen from the AFM line profiles, in experiment examples 2 and 3, protrusions 22 having a height H22 of at least 100 nm are formed. It should be noted that the direction in which the line profiles were measured does not coincide with the axial directions of the equilateral triangular lattice in which the protrusions 22 are distributed, so the intervals between the protrusions 22 appearing in the line profiles do not coincide with the pitches P22 of the protrusions 22.

In experiment examples 2 and 3, more or less the entirety of the valleys 13 between the bumps 12 are buried under AlN. Accordingly, compared to the bump-and-dip shape of the base surface 11, the portions of the surface 21 between the protrusions 22 approximate a more or less flat shape. Meanwhile, it is not necessary to have the valleys 13 between the bumps 12 completely buried under the layer 20, and there may be voids in the layer 20.

A comparison between experiment examples 2 and 3 reveals that while the portions of the surface 21 between the protrusions 22 in experiment example 2 have a greater degree of convexity and concavity and protrusions that grow along with the protrusions 22 and protrude obliquely can be observed, in experiment example 3, the portions of the surface 21 between the protrusions 22 have a lesser degree of convexity and concavity and is flattened more, and protrusions that grow along with the protrusions 22 and protrude obliquely are not observed. In view of this, it can be considered that the protrusions 22 that protrude in the height direction of the bumps 12 can be grown with higher selectivity if the height H12 of the bumps 12 are smaller. In view of other experiments as well that were additionally conducted while setting different heights H12 for the bumps 12, it can be concluded that relatively high selectivity, as shown by experiment example 2, can be achieved if the height H12 of the bumps 12 is, for example, smaller than or equal to 500 nm, and extremely high selectivity, as shown by experiment example 3, can be achieved if the height H12 is, for example, smaller than or equal to 300 nm.

In experiment examples 2 and 3, the portions of the surface 21 between the protrusions 22 are not completely flat. As can be observed in the SEM planar images, in particular, dips tend to form (remain) around the bases of the protrusions 22 in the portions of the surface 21 on the outside of the protrusions 22. Such dips can be regarded as a trace of the protrusions 22 having been formed through growth (the characteristic of the surface 21 being as-grown).

So, as has been described with reference to experiment examples 2 and 3, the inventors of the present disclosure have arrived at the novel finding that a layer 20 having periodically formed protrusions 22 can be obtained through growth. In experiment example 1, on the other hand, although such protrusions 22 are not formed, a layer 20 having a characteristic bump-and-dip shape is formed on the surface 21, as will be described below; this finding related to experiment example 1 is also a novel finding that the inventors of the present disclosure arrived at.

In experiment example 1, there is a tendency for AlN being buried in the valleys 13 between the bumps 12 less easily compared to experiment examples 2 and 3. On the surface 21 of the layer 20, bump shapes which more or less conform to the bump shapes of the bumps 12 are observed. The following minute structure is observed in each bump shape on the surface 21. Fin-like portions located one behind the other along the circumferential direction of each bump 12 are formed above the slant surface of the bump 12. A plurality of minute rod-like portions, which grow in a direction intersecting the slant surface of the bump 12, are formed between the fin-like portions located one behind the other along the circumferential direction of the bump 12. Other experiments that were additionally conducted while setting different heights H12 for the bumps 12 proved that a bump-and-dip shape involving clearly-observable fin-like portions are formed if the height H12 of the bumps 12 is as large as exceeding or equaling 1000 nm.

Second Embodiment

Figure 7:
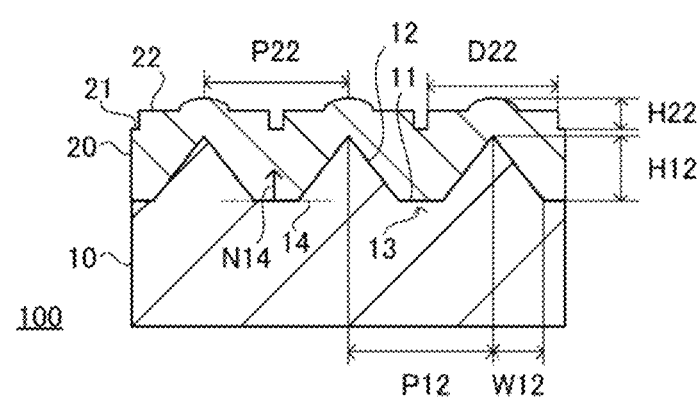
FIG. 7 is an illustrative schematic cross-sectional diagram of a laminate member 100 in a second embodiment.

Next, the laminate member 100 in a second embodiment will be described. FIG. 7 is an illustrative schematic cross-sectional diagram of the laminate member 100 in the second embodiment. The laminate member 100 in the second embodiment differs from that in the first embodiment in the form of the protrusions 22 of the layer 20. Specifically, as has been mentioned earlier, the second embodiment and experiment example 4 pertaining to the second embodiment exemplify plate-like protrusions 22 and protrusions 22 having a large diameter.

The substrate 10 is equivalent to that in the first embodiment. Likewise, similarly to the first embodiment, the height H12 of the bumps 12 is set to smaller than or equal to 500 nm and the layer 20 is grown by, for example, HVPE on the base surface 11 having undergone UV irradiation treatment so as to form the protrusions 22. Meanwhile, growth conditions for the layer 20 are changed from the first embodiment, so the form of the protrusions 22 are different from the first embodiment.

The following is an example of growth conditions that may be adopted in the second embodiment. The growth temperature may be 1050° C.-1300° C. The V/III ratio, i.e. the supply ratio of N raw material gas to Al raw material gas, may be 0.2-20. The growth speed may be 0.5-200 nm/min. For the purpose of preventing adhesion of AlN to nozzles of gas supply pipes used to introduce various gases to a growth chamber in an HVPE apparatus, hydrogen chloride (HCl) gas may be flown, and the amount of HCl gas supplied may be set such that the ratio of the HCl gas to the AlCl gas or the $AlCl_3$ gas is 0.1-100.

In other words, in the second embodiment, the layer 20 is grown under the growth conditions including a relatively high temperature, relatively low V/III ratio, and relatively low speed (compared to the growth conditions of the first embodiment described above); accordingly, the protrusions 22 are formed highly selectively above the apices of the bumps 12 such that the protrusions 22 formed are plate-like and have a large diameter.

Next, experiment example 4 pertaining to the second embodiment will be described. A substrate equivalent to that used in experiment example 3 was used as the substrate 10. In other words, a substrate in which the height H12 of the bumps 12 is 220 nm was used as the substrate 10. The growth conditions of the second embodiment exemplified above were adopted as the growth conditions for the layer 20. The layer 20 was grown by an amount such that the layer 20 would have a thickness of 700 nm if grown on a flat base surface.

Figures 8A, 8B:
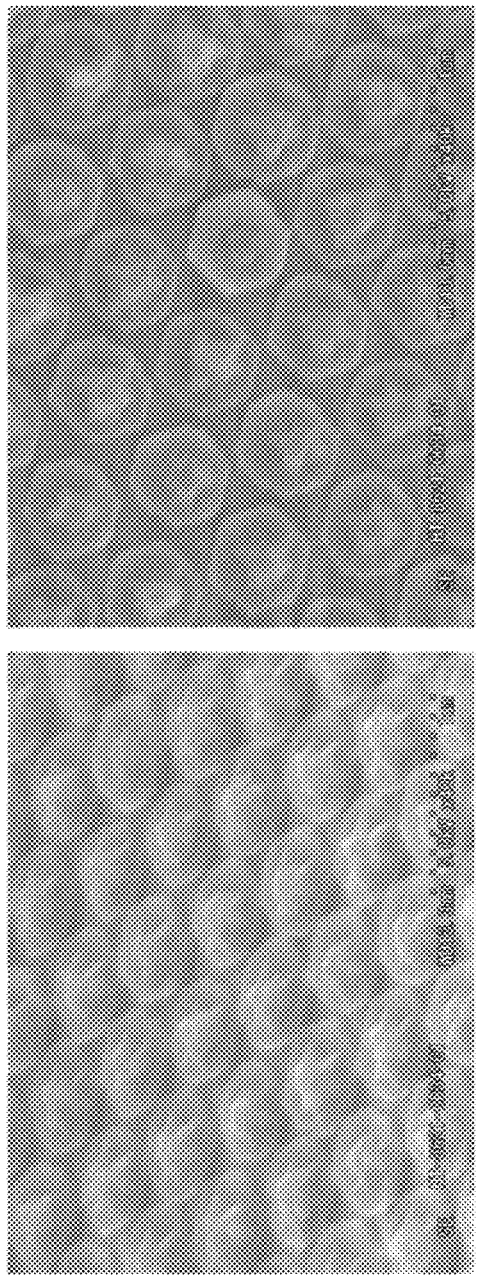
FIGS. 8A and 8B are an SEM perspective image and an SEM planar image showing results of experiment example 4.

FIGS. 8A and 8B illustrate results of experiment example 4. FIG. 8A is a SEM perspective image of the surface 21 of the layer 20 and FIG. 8B is a SEM planar image of the surface 21 of the layer 20. As can be seen from the SEM perspective image and the SEM planar image, in experiment example 4 pertaining to the second embodiment as well, similarly to experiment examples 2 and 3 pertaining to the first embodiment, protrusions 22 are formed selectively on the surface 21 of the layer 20 at the lattice points of the equilateral triangular lattice corresponding to locations above the apices of the bumps 12.

Whereas rod-like protrusions 22 having a small diameter are formed in experiment examples 2 and 3, plate-like protrusions 22 having a large diameter are formed in experiment example 4. In experiment example 4 as well, similarly to experiment examples 2 and 3, the external shape of the protrusions 22 in a plan view is more or less an equilateral hexagon, and an a-axis direction of the AlN forming the protrusions 22, i.e. each of the directions in which the centers and the vertices of the hexagons of the protrusions 22 are connected, is parallel to the axial directions of the equilateral triangular lattice.

In experiment example 4 as well, similarly to experiment examples 2 and 3, more or less the entirety of the valleys 13 between the bumps 12 are buried under AlN. Accordingly, compared to the bump-and-dip shape of the base surface 11, the portions of the surface 21 between the protrusions 22 approximate a more or less flat shape. Meanwhile, it is not necessary to have the valleys 13 between the bumps 12 completely buried under the layer 20, and there may be voids in the layer 20.

It can be observed for the protrusions 22 formed in experiment example 4 that a bulge having an irregular shape tends to form in the center of each protrusion 22. Such bulges can be regarded as a trace of the protrusions 22 having been formed through growth (the characteristic of the surface 21 being as-grown). Thus, in experiment example 4 as well, the finding that protrusions 22 can be obtained through growth is confirmed.

As has been described above, according to the first and second embodiments, a layer 20 having a surface 21 on which protrusions 22 are formed periodically can be obtained through growth, i.e. a surface 21, which is an as-grown surface on which protrusions 22 are formed periodically, can be obtained. Thus, no complex processes for forming protrusions 22 are required. Moreover, since such processes are not required, the AlN crystals can be prevented from damage that is caused by such processes.

The layer 20 newly discovered by the inventors of the present disclosure, on which the protrusions 22 are formed periodically, may be used in any application. Since the size D22 and the height H22 of the protrusions 22 can be nano-sized to below 1 μm, use of the layer 20 as a material for a device employing a nano-sized structure may be anticipated. To cite an example, the layer 20 is expected to be used in optical resonators that use whispering gallery modes (WGMs) propagating upon the protrusions 22, a more specific example of such optical resonators being one in which visible light having entered the resonator undergoes wavelength conversion based on the non-linear optical effect of AlN, resulting in the emission of ultraviolet rays. The layer 20 may be used in the form of the laminate member 100 in which the layer 20 is laminated on the substrate 10, or may be used having been separated from the substrate 10.

Other Embodiments

The present disclosure is not limited to the embodiments described above and may be modified in various ways as long as the spirit of the disclosure is maintained. Moreover, the various embodiments may be combined, as appropriate.

The first and second embodiments above describe examples of a substrate 10 in which bumps 12 are distributed on lattice points of an equilateral triangular lattice and the axial directions of the equilateral triangular lattice are parallel to an m-axis direction of the sapphire forming the substrate 10. In other words, exemplified is a layer 20 in which, in accordance with the configuration of the substrate 10, an a-axis direction of the AlN forming the protrusions 22 is parallel to the axial directions of the equilateral triangular lattice. Meanwhile, as described above, the axial directions of the equilateral triangular lattice are not limited to an m-axis direction of the sapphire and may be other directions.

Figure 9:
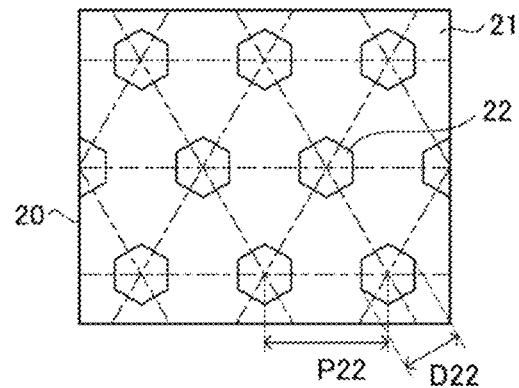
FIG. 9 is a schematic plan view of the layer 20, exemplifying another embodiment in which the axial directions of an equilateral triangular lattice in which bumps 12 are distributed are parallel to an a-axis direction of sapphire forming the substrate 10.

FIG. 9 is a schematic plan view of the layer 20, exemplifying a mode in which the bumps 12 are distributed on lattice points of an equilateral triangular lattice and the axial directions of the equilateral triangular lattice are parallel to an a-axis direction of the sapphire forming the substrate 10. In this mode, an m-axis direction of the AlN forming the layer 20 is parallel to the axial directions of the equilateral triangular lattice, and hence, m-axis directions of the AlN forming the protrusions 22 are parallel to one another.

Figure 10:
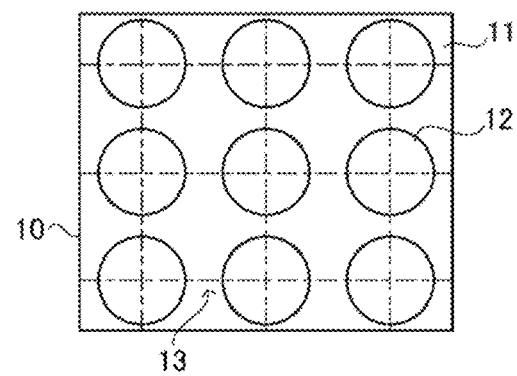
FIG. 10 is a schematic plan view of the substrate 10, exemplifying another embodiment in which the bumps 12 are distributed in a quadrilateral lattice pattern.
Figure 11:
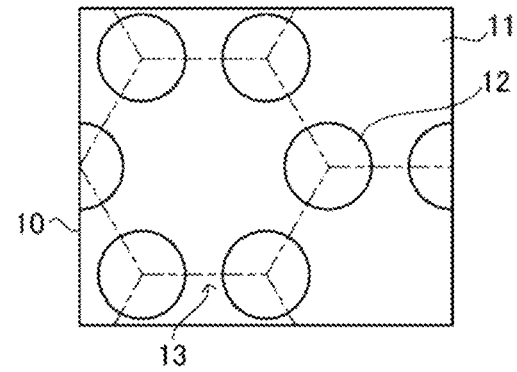
FIG. 11 is a schematic plan view of the substrate 10, exemplifying another embodiment in which the bumps 12 are distributed in a hexagonal lattice pattern.

The first and second embodiments above describe a triangular lattice (e.g. equilateral triangular lattice) as an example of two-dimensional periodic distribution of the bumps 12. Meanwhile, as described above, the two-dimensional periodic distribution of the bumps 12 is not limited to a triangular lattice, and may be a quadrangular lattice or a hexagonal lattice, for example. FIGS. 10 and 11 are schematic plan views of the substrate 10, illustrating a quadrangular lattice (e.g. square lattice) and a hexagonal lattice (e.g. equilateral hexagonal lattice) as examples of the two-dimensional periodic distribution of the bumps 12.

Figure 12:
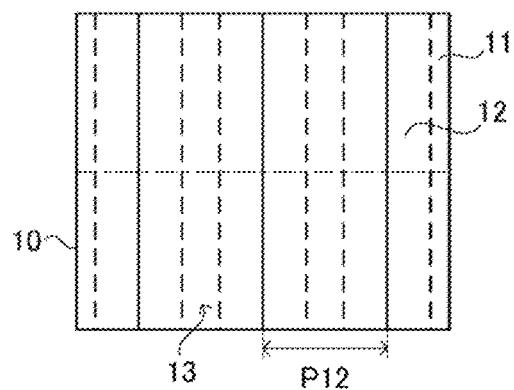
FIG. 12 is a schematic plan view of the substrate 10, exemplifying another embodiment in which ridge-like bumps 12 are distributed.

The first and second embodiments above exemplify conical bumps 12, but the shape of the bumps 12 is not limited to a conical shape. Moreover, although the first and second embodiments above exemplify modes in which the periodic distribution of the bumps 12 is two-dimensional, the periodic distribution of the bumps 12 is not limited to a two-dimensional one. FIG. 12 is a schematic plan view illustrating an example of a substrate 10 in which ridge-like bumps 12 are distributed periodically and one-dimensionally in such a way that the directions in which the ridges extend are parallel to one another. The solid lines and the broken lines extending in the up-down direction in the drawing indicate ridge lines and valley lines of the bumps 12, respectively.

Preferable Aspects of the Present Disclosure

Preferable aspects of the present disclosure will be supplementarily described hereafter.

Supplementary Description 1

An aluminum nitride laminate member including
a sapphire substrate having a base surface on which bumps are distributed periodically, each bump having a height of smaller than or equal to 500 nm, and
an aluminum nitride layer provided (grown) on the base surface and having a surface on which protrusions are formed above apices of the bumps.

Supplementary Description 2

The aluminum nitride laminate member of Appendix 1, wherein, in a plan view, the external shape of each of the protrusions is a shape of a hexagon.

Supplementary Description 3

The aluminum nitride laminate member of Appendix 1 or 2, wherein, for each of the protrusions, the height of the protrusion is larger than or equal to the size of the protrusion, the size being defined by the length of a diagonal passing through the center of the hexagon.

Supplementary Description 4

The aluminum nitride laminate member of Appendix 1 or 2, wherein, for each of the protrusions, the height of the protrusion is smaller than the size of the protrusion, the size being defined by the length of a diagonal passing through the center of the hexagon.

Supplementary Description 5

The aluminum nitride laminate member of Appendix 1 or 2, wherein, for each of the protrusions, the size of the protrusion is smaller than or equal to ½ a pitch between the protrusion and the closest adjacent protrusion among the protrusions, the size being defined by the length of a diagonal passing through the center of the hexagon.

Supplementary Description 6

The aluminum nitride laminate member of Appendix 1 or 2, wherein, for each of the protrusions, the size of the protrusion is larger than ½ a pitch between the protrusion and the closest adjacent protrusion among the protrusions, the size being defined by the length of a diagonal passing through the center of the hexagon.

Supplementary Description 7

The aluminum nitride laminate member of Appendix 1 or 2, wherein, for each of the protrusions, the height of the protrusion is larger than or equal to the size of the protrusion, the size being defined by the length of a diagonal passing through the center of the hexagon, and for each of the protrusions, the size of the protrusion is smaller than or equal to ½ a pitch between the protrusion and the closest adjacent protrusion among the protrusions, the size being defined by the length of a diagonal passing through the center of the hexagon.

Supplementary Description 8

The aluminum nitride laminate member of Appendix 7, wherein in portions of the surface on the outside of the protrusions, dips are formed at bases of the protrusions.

Supplementary Description 9

The aluminum nitride laminate member of Appendix 7 or 8, wherein the height of each of the protrusions is larger than or equal to 100 nm.

Supplementary Description 10

The aluminum nitride laminate member of Appendix 1 or 2, wherein, for each of the protrusions, the height of the protrusion is smaller than the size of the protrusion, the size being defined by the length of a diagonal passing through the center of the hexagon, and for each of the protrusions, the size of the protrusion is larger than ½ a pitch between the protrusion and the closest adjacent protrusion among the protrusions, the size being defined by the length of a diagonal passing through the center of the hexagon.

Supplementary Description 11

The aluminum nitride laminate member of Appendix 10, wherein a bulge is formed at the center of each of the protrusions.

Supplementary Description 12

The aluminum nitride laminate member of any one of Appendices 1 to 11, wherein the c-axis directions of aluminum nitride forming the protrusions are parallel to one another.

Supplementary Description 13

The aluminum nitride laminate member of any one of Appendices 1 to 12, wherein the c-axis direction of aluminum nitride forming each of the protrusions is parallel to the height direction of each of the bumps.

Supplementary Description 14

The aluminum nitride laminate member of any one of Appendices 1 to 13, wherein a-axis directions of aluminum nitride forming the protrusions are parallel to one another.

Supplementary Description 15

The aluminum nitride laminate member of any one of Appendices 1 to 14, wherein m-axis directions of aluminum nitride forming the protrusions are parallel to one another.

Supplementary Description 16

The aluminum nitride laminate member of any one of Appendices 1 to 15, wherein the height direction of the bumps is parallel to the c-axis direction of sapphire forming the sapphire substrate.

Supplementary Description 17

The aluminum nitride laminate member of any one of Appendices 1 to 16, wherein the shape of each of the bumps is conical.

Supplementary Description 18

The aluminum nitride laminate member of Appendix 17, wherein the bumps are distributed on lattice points of a triangular lattice, a quadrangular lattice, or a hexagonal lattice.

Supplementary Description 19

The aluminum nitride laminate member of Appendix 18, wherein the directions of the axes of the triangular lattice, the quadrangular lattice, or the hexagonal lattice are parallel to an m-axis direction or an a-axis direction of sapphire forming the sapphire substrate.

Supplementary Description 20

The aluminum nitride laminate member of Appendix 1, wherein each of the bumps assumes the shape of a ridge and the bumps are distributed in such a way that the directions in which the ridges extend are parallel to one another.

Supplementary Description 21

The aluminum nitride laminate member of any one of Appendices 1 to 20, wherein each of the bumps assumes the shape of a cone or a ridge and the width of a slant surface of each of the bumps in a plan view is smaller than or equal to 500 nm.

Supplementary Description 22

The aluminum nitride laminate member of any one of Appendices 1 to 21, wherein a pitch between a bump and the closest adjacent bump among the bumps is smaller than or equal to 1000 nm.

Supplementary Description 23

An aluminum nitride layer having a surface on which protrusions are formed periodically, wherein
in a plan view, the external shape of each of the protrusions is a shape of a hexagon,
for each of the protrusions, the height of the protrusion is larger than or equal to the size of the protrusion, the size being defined by the length of a diagonal passing through the center of the hexagon,
for each of the protrusions, the size of the protrusion is smaller than or equal to ½ a pitch between the protrusion and the closest adjacent protrusion among the protrusions, the size being defined by the length of a diagonal passing through the center of the hexagon, and
in portions of the surface on the outside of the protrusions, dips are formed at bases of the protrusions.

Supplementary Description 24

An aluminum nitride layer having a surface on which protrusions are formed periodically, wherein,
in a plan view, the external shape of each of the protrusions is a shape of a hexagon,
for each of the protrusions, the height of the protrusion is smaller than the size of the protrusion, the size being defined by the length of a diagonal passing through the center of the hexagon,
for each of the protrusions, the size of the protrusion is larger than ½ a pitch between the protrusion and the closest adjacent protrusion among the protrusions, the size being defined by the length of a diagonal passing through the center of the hexagon, and
a bulge is formed at the center of each of the protrusions.

Supplementary Description 25

An aluminum nitride laminate member including
a sapphire substrate having a base surface on which bumps are distributed periodically, each of the bumps having a height of larger than or equal to 1000 nm and having a slant surface, and
an aluminum nitride layer grown on the base surface and having a surface on which fin-like portions are formed above the slant surface of each of the bumps, the fin-like portions being located one behind the other along the circumferential direction of the bump, a plurality of rod-like portions being formed between the fin-like portions located one behind the other along the circumferential direction of the bump, the rod-like portions having grown in a direction intersecting the slant surface.

What is claimed is:
1. An aluminum nitride laminate member comprising sapphire substrate having a base surface on which bumps are distributed periodically, each bump having a height of smaller than or equal to 500 nm, and
an aluminum nitride layer provided on the base surface and having a surface on which protrusions are formed above apices of the bumps.
2. The aluminum nitride laminate member of claim 1, wherein, in a plan view, the external shape of each of the protrusions is a shape of a hexagon.
3. The aluminum nitride laminate member of claim 2, wherein, for each of the protrusions, the height of the protrusion is larger than or equal to the size of the protrusion, the size being defined by the length of a diagonal passing through the center of the hexagon.
4. The aluminum nitride laminate member of claim 2, wherein, for each of the protrusions, the height of the protrusion is smaller than the size of the protrusion, the size being defined by the length of a diagonal passing through the center of the hexagon.
5. The aluminum nitride laminate member of claim 2, wherein, for each of the protrusions, the size of the protrusion is smaller than or equal to ½ a pitch between the protrusion and the closest adjacent protrusion among the protrusions, the size being defined by the length of a diagonal passing through the center of the hexagon.
6. The aluminum nitride laminate member of claim 2, wherein, for each of the protrusions, the size of the protrusion is larger than ½ a pitch between the protrusion and the closest adjacent protrusion among the protrusions, the size being defined by the length of a diagonal passing through the center of the hexagon.
7. The aluminum nitride laminate member of claim 1, wherein c-axis directions of aluminum nitride forming the protrusions are parallel to one another.
8. The aluminum nitride laminate member of claim 1, wherein a-axis directions of aluminum nitride forming the protrusions are parallel to one another.
9. The aluminum nitride laminate member of claim 1, wherein m-axis directions of aluminum nitride forming the protrusions are parallel to one another.
10. The aluminum nitride laminate member of claim 1, wherein the shape of each of the bumps is conical.
11. The aluminum nitride laminate member of claim 10, wherein the bumps are distributed on lattice points of a triangular lattice, a quadrangular lattice, or a hexagonal lattice.
12. The aluminum nitride laminate member of claim 1, wherein each of the bumps assumes the shape of a ridge and the bumps are distributed in such a way that the directions in which the ridges extend are parallel to one another.
13. The aluminum nitride laminate member of claim 1, wherein each of the bumps assumes the shape of a cone or a ridge and the width of a slant surface of each of the bumps in a plan view is smaller than or equal to 500 nm.
14. The aluminum nitride laminate member of claim 1, wherein a pitch between a bump and the closest adjacent bump among the bumps is smaller than or equal to 1000 nm.
15. An aluminum nitride layer having a surface on which protrusions are formed periodically, wherein
in a plan view, the external shape of each of the protrusions is a shape of a hexagon,
for each of the protrusions, the height of the protrusion is larger than or equal to the size of the protrusion, the size being defined by the length of a diagonal passing through the center of the hexagon,
for each of the protrusions, the size of the protrusion is smaller than or equal to ½ a pitch between the protrusion and the closest adjacent protrusion among the protrusions, the size being defined by the length of a diagonal passing through the center of the hexagon, and in portions of the surface on the outside of the protrusions, dips are formed at bases of the protrusions.

16. An aluminum nitride layer having a surface on which protrusions are formed periodically, wherein
- in a plan view, the external shape of each of the protrusions is a shape of a hexagon,
- for each of the protrusions, the height of the protrusion is smaller than the size of the protrusion, the size being defined by the length of a diagonal passing through the center of the hexagon,
- for each of the protrusions, the size of the protrusion is larger than ½ a pitch between the protrusion and the closest adjacent protrusion among the protrusions, the size being defined by the length of a diagonal passing through the center of the hexagon, and
- a bulge is formed at the center of each of the protrusions.

* * * * *